United States Patent
Taylor

(10) Patent No.: US 7,053,716 B2
(45) Date of Patent: May 30, 2006

(54) CONTROLLED IMPEDANCE BIAS CIRCUIT

(75) Inventor: Stewart S. Taylor, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 27 days.

(21) Appl. No.: 10/845,213

(22) Filed: May 14, 2004

(65) Prior Publication Data

US 2005/0253657 A1     Nov. 17, 2005

(51) Int. Cl.
*H03F 3/04* (2006.01)

(52) U.S. Cl. ........................ 330/296; 330/285
(58) Field of Classification Search ................ 330/256, 330/285, 288; 323/315, 316
See application file for complete search history.

(56) References Cited

U.S. PATENT DOCUMENTS

| | | | |
|---|---|---|---|
| 6,122,532 A | 9/2000 | Taylor | 455/574 |
| 6,215,355 B1 * | 4/2001 | Meck et al. | 330/51 |
| 6,233,440 B1 | 5/2001 | Taylor | 455/127 |
| 6,515,546 B1 * | 2/2003 | Liwinski | 330/296 |
| 6,750,722 B1 * | 6/2004 | Newman et al. | 330/296 |
| 6,819,185 B1 * | 11/2004 | Jensen | 330/296 |
| 2002/0125945 A1 | 9/2002 | Taylor | 330/129 |
| 2002/0180521 A1 | 12/2002 | Taylor | 330/129 |
| 2003/0058045 A1 | 3/2003 | Taylor et al. | 330/133 |
| 2004/0043742 A1 | 3/2004 | Beumer | 455/323 |

OTHER PUBLICATIONS

"High-Frequency Nonlinearity Analysis of Common-Emitter and Differential-Pair Transconductance Stages", Keng Leong Fong, et al., IEEE Journal of Solid-State Circuits, vol. 33, No. 4, Apr. 1998.

"A High $IIP_3$ Low Noise Amplifier for 1900 MHz Applications Using the SiGe BFP620 Transistor", By Gerard Wevers, Infineon Technologies, Applied Microwave & Wireless, Jul. 2000.

"High-Frequency Anaylsis of Linearity Improvement Technique of Common-Emitter Transconductance Stage Using a Low-Frequency-Trap Network", Keng Leong Fong, IEEE Journal of Solid-State Circuits, vol. 35, No. 8, Aug. 2000.

* cited by examiner

*Primary Examiner*—Henry Choe
(74) *Attorney, Agent, or Firm*—Fleshner & Kim, LLP

(57) ABSTRACT

A bias circuit is provided to present a controlled impedance to an input of an RF amplifier to improve linearity of the RF amplifier. The bias circuit may control the impedance such that a low impedance is presented to the input of the amplifier at low frequencies and a high impedance is presented to the input of the amplifier at high frequencies.

27 Claims, 5 Drawing Sheets

CONTROLLED IMPEDANCE BIAS CIRCUIT

FIELD

Embodiments of the present invention may relate to circuit design. More particularly, embodiments of the present invention may relate to bias circuits.

BACKGROUND

In cellular telephones and other communication devices, radio frequency (RF) power amplifiers are typically used to amplify RF signals prior to transmission. These RF power amplifiers may generate an output power in the range of 1 mW to 3 W. In such devices, linear amplification may be desired to prevent signal distortion. Efficiency is also a consideration, especially for mobile devices such as cellular telephones, due to the limited quantity of energy stored in the accompanying battery.

Efficiency and linearity are often competing considerations. When high efficiency is important, a low amplifier transistor bias current may be chosen, thereby increasing battery life and talk time. This generally results in acceptable distortion at low to moderate power levels, but creates unacceptable distortion at high power levels. When high linearity is important, a larger transistor bias current may be chosen, reducing distortion to an acceptable level even at high power levels. The high bias current may also be required to obtain the maximum output power from the amplifier output transistor. However, the high bias current may reduce battery life and talk time, particularly at low power levels.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

The following represents brief descriptions of the drawings in which like reference numerals represent like elements and wherein.

DETAILED DESCRIPTION

Figure 1:
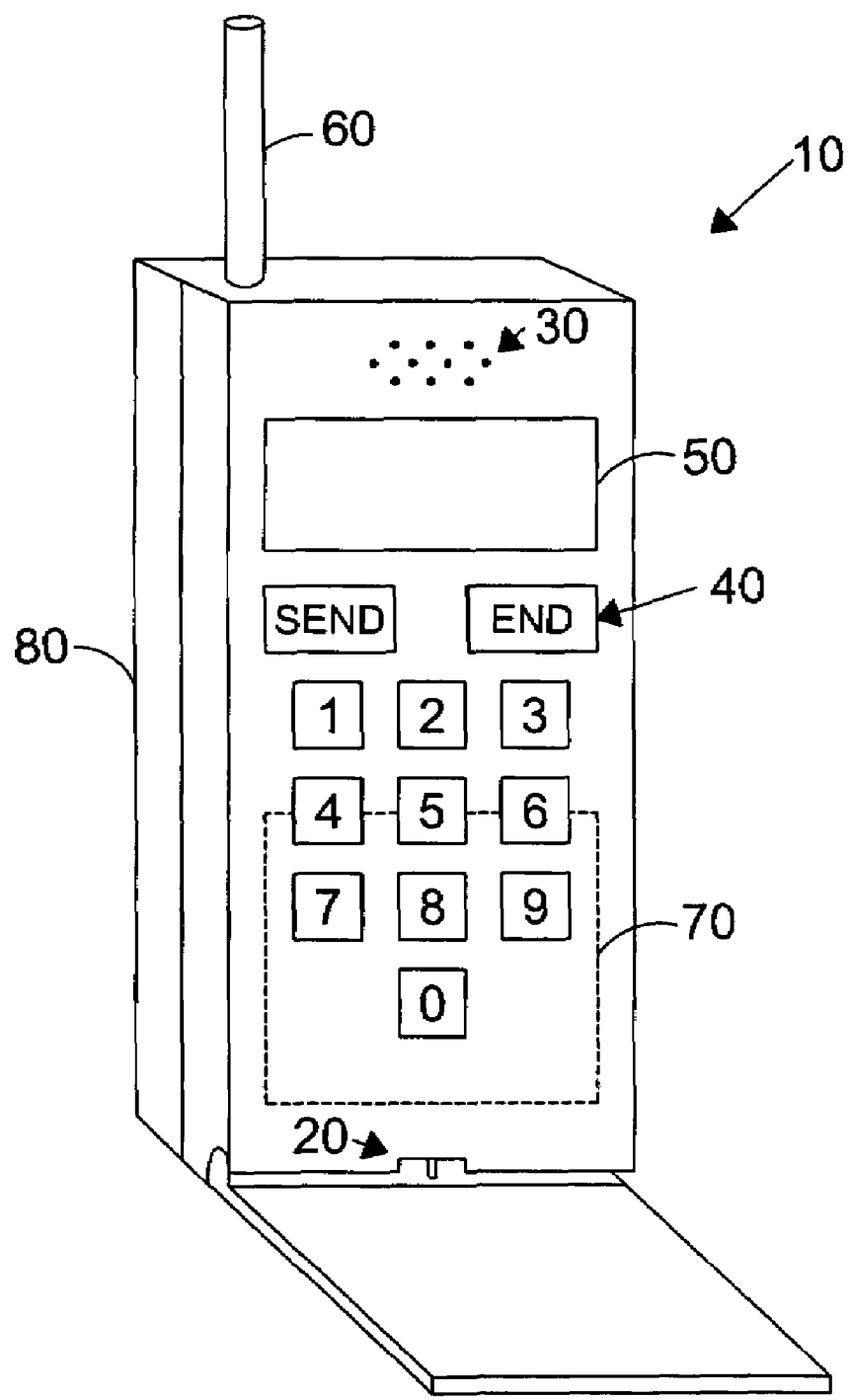
FIG. 1 shows a mobile telephone constructed in a manner to include embodiments of the present invention.

In the following detailed description, like reference numerals and characters may be used to designate identical, corresponding or similar components in differing figure drawings. Further, in the detailed description to follow, example sizes/models/values/ranges may be given although embodiments of the present invention are not limited to the same. Well-known power/ground connections to integrated circuits (ICs) and other components may not be shown within the FIGs. for simplicity of illustration and discussion. Where specific details are set forth in order to describe example embodiments of the invention, it should be apparent to one skilled in the art that embodiments of the present invention can be practiced without these specific details.

Embodiments of the present invention may provide a bias circuit to present a controlled impedance to an input of an amplifier to improve linearity of the amplifier. The bias circuit may control the impedance such that a low impedance is presented to the input of the amplifier at low frequencies and a high impedance is presented to the input of the amplifier at high frequencies. Embodiments of the present invention may be used in RF circuits such as for mobile telephones or networks (such as an RF wide local area network (WLAN))

In contrast, disadvantageous RF bias circuits may include a current mirror and a feed/isolation resistor. For these circuits, the impedance at DC and all frequencies may be approximately equal to a value of the feed resistor (such as 5K ohms). That is, a value of 5K ohms may be chosen for the feed resistor to minimize noise and avoid interaction with a matching network (loading).

Embodiments of the present invention may provide a CMOS bias circuit that provides a low impedance at DC and a modulation bandwidth of RF circuits while having a high impedance at RF frequencies (such as 1 GHz or greater). This may be particularly useful and important since a low impedance at the modulation bandwidth may improve a third-order intercept point ($iIP_3$), which may in turn result in lower third-order distortion. Disadvantageous low noise amplifiers (LNAs) may employ off-chip inductors and low impedance bias circuits so as to terminate (or reduce) tone difference frequencies. Otherwise, the $iIP_3$ can be larger, varying with tone spacing, and/or result in asymmetrical $iIP_3$. However, the use of an off-chip inductor may be undesirable in these disadvantageous arrangements for cost and I/O requirements (i.e., an on-chip inductor may be large, increasing cost, and may degrade performance due to its relatively low Q). Another biasing approach may use a low impedance bias circuit having a small-valued bias feed resistor. This may improve linearity, but at the expense of degraded noise and interaction with the matching network. Additionally, low impedance at the modulation bandwidth may also improve linearity of LNAs, power amplifiers (PAs), and other circuits. This may also prevent a shift in a bias point of a MOSFET driven by a large voltage and resulting from a nonlinear, voltage-dependant capacitance, such as in a passive mixer (triode mixer, Maas mixer).

A low DC impedance may also be useful and important for large, short gate length transistors where gate tunneling current is significant. If biased with a resistor, the DC voltage drop across the biasing resistor may de-bias the transistor and change with drive conditions, temperature, or process. Large transistors employed for power amplifiers and RF switches may have gate currents of 100 uA–1 mA. Bias circuits may therefore have an impedance of a few ohms or less to avoid shifting/changing the bias point significantly with drive signal, and consume little power. This may be particularly true for linear power amplifiers. That is, bias shifts result in a softer compression characteristic, degrading linearity and efficiency.

Embodiments of the present invention may therefore provide a bias circuit to present a controlled impedance to an input (i.e, a gate) of an amplifier to improve the linearity of the amplifier. The bias circuit may control the impedance such that a low impedance is presented to the input of the amplifier at low frequencies and a high impedance is presented to the input of the amplifier at high frequencies. Embodiments of the present invention may utilize a negative feedback loop that includes a non-inverting amplifier and a resistor. A frequency response of the non-inverting amplifier within the negative feedback loop may be contoured to provide a desired response.

Embodiments of the present invention may provide a low-power CMOS bias circuit that does not degrade noise performance (or not significantly). The bias circuit may have a very low impedance at DC and the modulation bandwidth. The bias circuit may further have an impedance that rises with frequency so that the bias circuit does not affect the RF gain and matching. The controlled output impedance may result from shunt feedback, high loop-gain and frequency compensation.

FIG. 1 shows a mobile telephone constructed in a manner to include embodiments of the present invention. Other mobile telephones, devices and embodiments are also within the scope of the present invention. More specifically, FIG. 1 shows a mobile telephone 10 that includes a microphone 20, a speaker 30, a keypad 40, a display screen 50, and a radio frequency (RF) antenna 60 for sending and receiving signals from a station such as a cell tower (not shown). The mobile telephone 10 also includes internal circuitry 70 powered by a battery 80. The mobile telephone 10 may be compliant with a signal frequency and modulation standard such as AMPS, PCS, GSM, CDMA, TDMA, DCS 1800 or some other telecommunications standard.

The internal circuitry 70 may be coupled to the speaker 30 and the microphone 20 for communicating with a user. The internal circuitry 70 may also be coupled to the keypad 40 to receive information regarding keypad entries made by the user. The internal circuitry 70 may also be coupled to the RF antenna 60 to send and receive identification signals, voice signals, keypad entries and other information to and from the station.

The internal circuitry 70 may communicate with the station via RF signals transmitted through the atmosphere. To generate the RF signals, the internal circuitry 70 may include one or more RF power amplifiers (not shown in FIG. 1) capable of amplifying RF signals.

Figure 2:
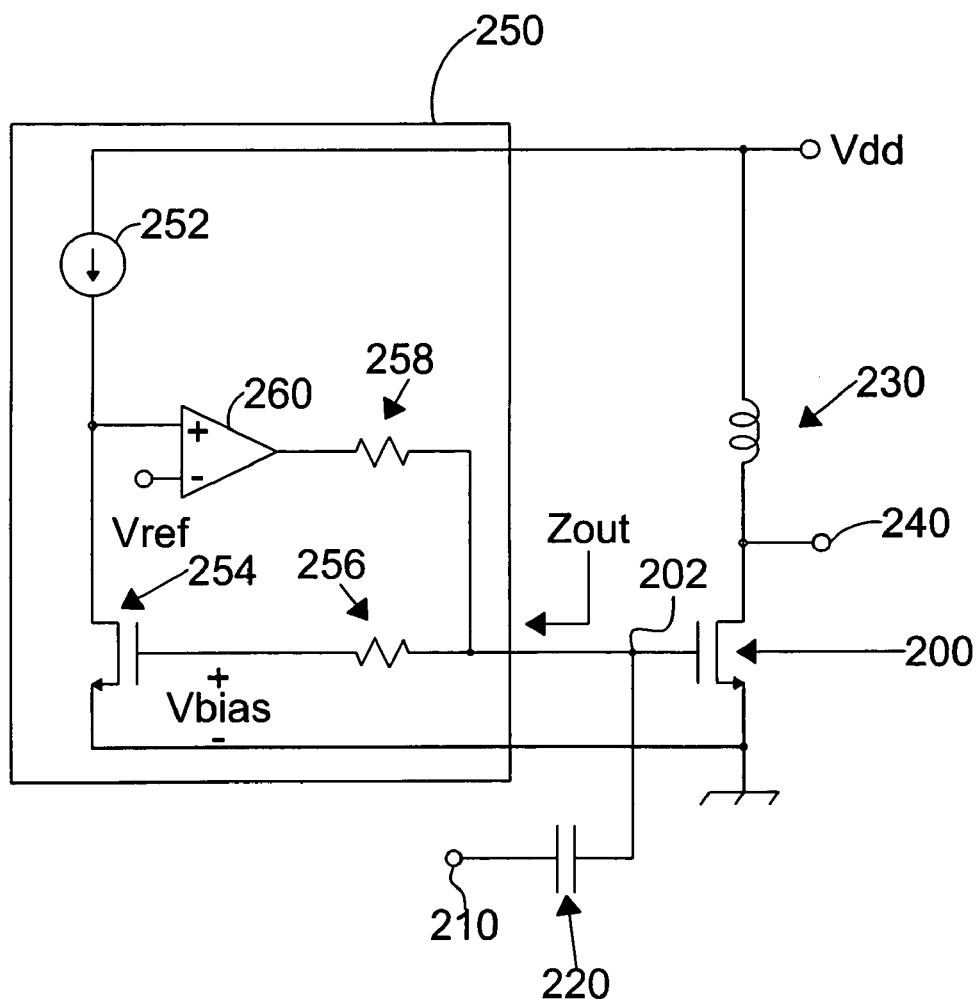
FIG. 2 is a circuit diagram of an RF amplifier and bias circuit according to an example embodiment of the present invention.

FIG. 2 is a circuit diagram of an RF amplifier and bias circuit according to an example embodiment of the present invention. Other embodiments and configurations are also within the scope of the present invention. As one example, the RF amplifier and bias circuit may be provided within the mobile telephone 10 shown in FIG. 1. The RF amplifier and bias circuit may also be provided within other devices, systems or networks (such as a RF WLAN) that may utilize radio frequencies. Further, the following discussion may refer to both an RF amplifier and a bias circuit, although both may be considered as one device or circuit. Further, both the RF amplifier and the bias circuit may be provided on a single chip.

More specifically, FIG. 2 shows an amplifying transistor 200 having a drain coupled to an output node 240 and a source coupled to GROUND. A gate of the amplifying transistor 200 may correspond to an input terminal 202 of the amplifying transistor 200. Additionally, an inductor 230 may be coupled between a voltage source Vdd and the drain of the amplifying transistor 200. Although not shown in FIG. 2, an amplifying device may be in the form of a cascoded transistor, as opposed to the single transistor 200.

An RF signal may be applied to an input node 210. The RF signal may pass through a coupling capacitor 220 and to the input terminal 202 of the amplifying transistor 200.

FIG. 2 also shows a bias circuit 250 coupled to the input terminal 202 of the amplifying transistor 200. The bias circuit 250 includes an inverting amplifier 254 in the form of a transistor (or current mirror transistor). The inverting amplifier 254 may have a source coupled to GROUND, a gate coupled to a first end of a resistor 256 and a drain coupled to a current source 252. A second end of the resistor 256 may be coupled to the input terminal 202 of the amplifying transistor 200. The resistor 256 acts as an isolating resistor and may have a value of 10K ohms, for example.

The bias circuit 250 also includes a non-inverting amplifier 260 and a resistor 258 coupled in series in a negative feedback loop of the bias circuit 250. More specifically, a drain of the inverting amplifier 254 is coupled to a positive input terminal of the non-inverting amplifier 260. A Vref signal may be applied to a negative input terminal of the non-inverting amplifier 260. The Vref signal may establish the drain voltage of the amplifier 254. The output of the amplifier 260 is coupled to a first end of the resistor 258 and a second end of the resistor 258 may be coupled to the input terminal 202 of the amplifying transistor 200. The resistor 258 may therefore act as an isolating resistor and may have a value of 10K ohms, for example. The amplifier 260 may have a frequency response specifically contoured to obtain a desired result.

The bias circuit 250 may be configured such that at low frequency (i.e., at or near DC current), the impedance (shown as $Z_{out}$ in FIG. 2) presented to the input terminal 202 of the amplifying transistor 200 is very low. As stated above, the frequency response of the amplifier 260 may be specifically contoured. For example, the frequency response may be contoured such that a gain of the amplifier 260 remains relatively constant at lower frequencies so that the impedance $Z_{out}$ may remain low. At some point, the gain of the amplifier 260 may roll off. For example, at 1 MHz, the gain of the amplifier 260 may decrease while the impedance at the input terminal 202 may become very high. Accordingly, embodiments of the present invention may present a controlled impedance ($Z_{out}$) to the input terminal 202 of the amplifying transistor 200 to improve the linearity of the amplifier (i.e., the amplifying transistor 200).

Figure 3:
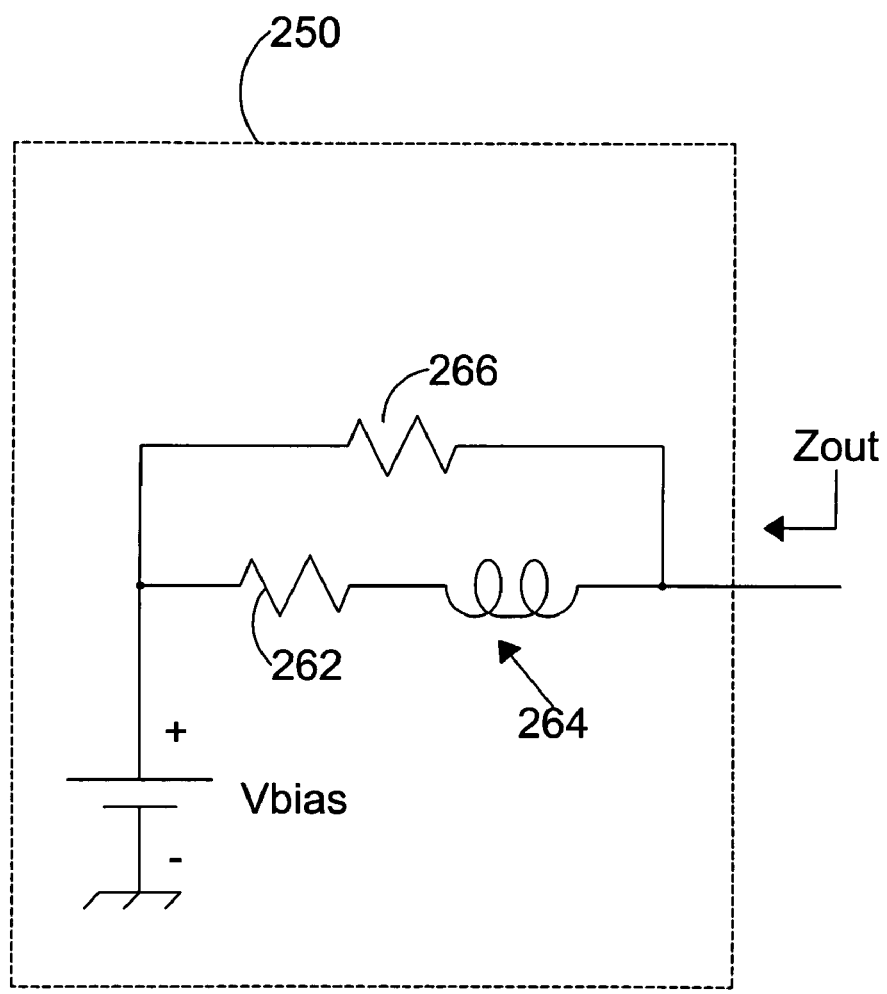
FIG. 3 is an equivalent circuit diagram of the bias circuit shown in FIG. 2.

FIG. 3 is an equivalent circuit diagram of the bias circuit 250 shown in FIG. 2. Other embodiments and configurations are also within the scope of the present invention. More specifically, the bias circuit 250 includes a resistor 262 and an inductor 264 coupled in parallel with a resistor 266. As one example, the resistor 266 may have a value of 10K ohms, the resistor 262 may have a value of 1 ohm and the inductor 264 may have a value of 1–10 uH. Other values are also within the scope of the present invention. In this equivalent bias circuit, at low frequencies (i.e., DC current), the impedance $Z_{out}$ presented to the input terminal 202 of the amplifying transistor 200 may correspond to the resistor 262. That is, the impedance $Z_{out}$ may be a very low value. As the frequency increases, the impedance $Z_{out}$ presented to the input terminal 202 of the amplifying transistor 200 also increases. All the components shown in FIG. 3 may be provided on a single chip.

Figure 4:
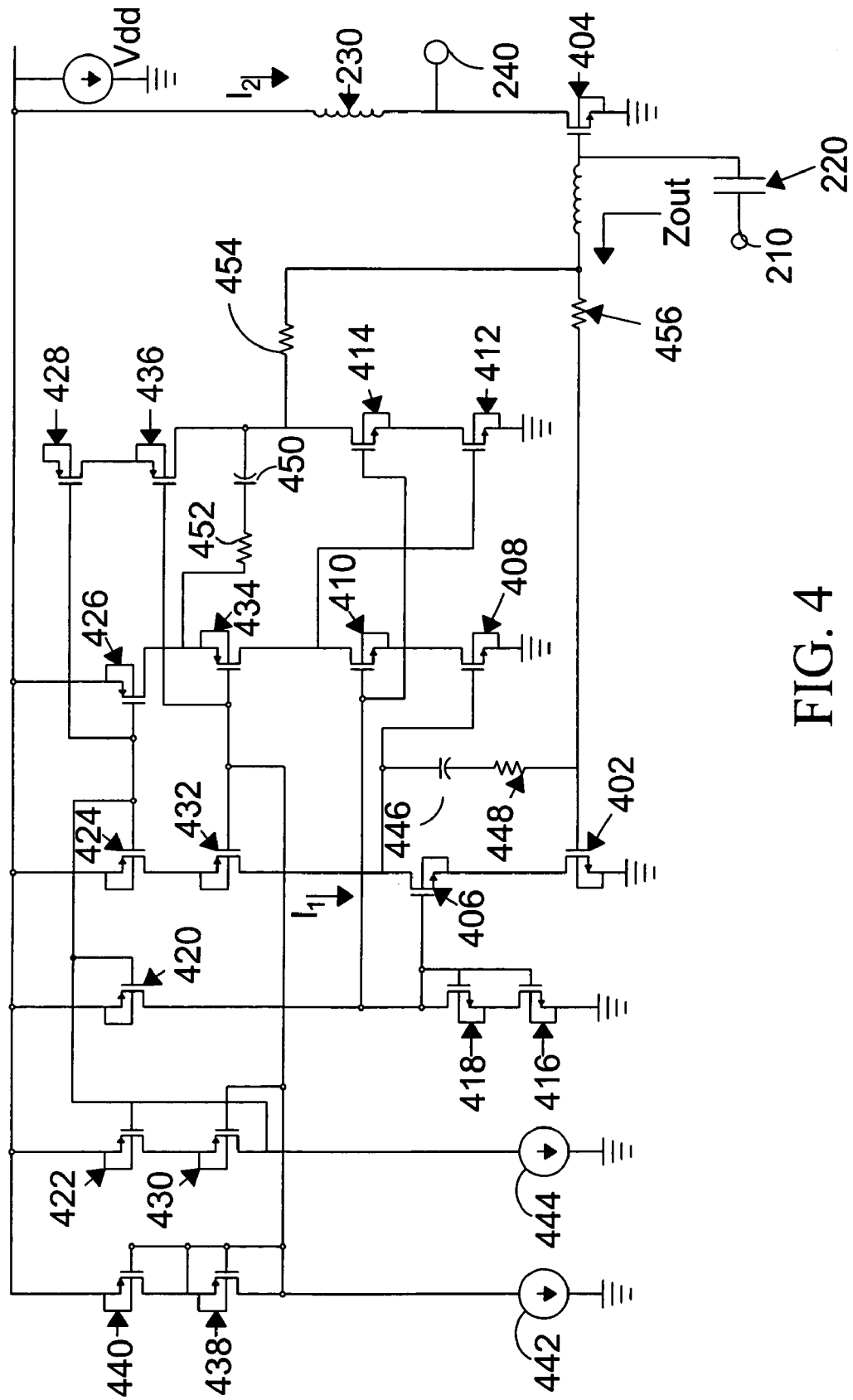
FIG. 4 is a circuit diagram of an RF amplifier and bias circuit according to an example embodiment of the present invention.

FIG. 4 is a circuit diagram of an RF amplifier and bias circuit according to an example embodiment of the present invention. Other embodiments and configurations are also within the scope of the present invention. As one example, the RF amplifier and bias circuit may be provided within the mobile telephone 10 shown in FIG. 1. The RF amplifier and bias circuit may also be provided within other devices, systems or networks that may utilize radio frequencies. Further, the following discussion may refer to both an RF amplifier and a bias circuit, although both may be considered as one device or circuit. Further, both the RF amplifier and the bias circuit may be provided on a single chip.

More specifically, FIG. 4 shows transistors 402 and 404 that form a current mirror in which transistor 402 is a reference transistor and transistor 404 is a controlling transistor (or amplifying transistor). As one example, the transistor 404 may be an RF transistor for a low noise amplifier (LNA) or a power amplifier (PA). If the gate length is the same for both the transistor 402 and the transistor 404, then the current I2 may be represented by $$I_2 \cong I_1 \frac{W_2}{W_1}.$$

Transistor 406 may be a cascode device that enhances a gain of the transistor 402 by raising its output resistance. Transistors 408 and 410 and transistors 412 and 414 form cascode common-source amplifiers similar to transistors 402 and 406. Transistors 416 and 418 may be fed by current source transistor 420 to establish a bias voltage for the transistors 406, 410 and 414, while keeping transistors 402, 408 and 412 somewhat above a knee voltage during saturation.

Transistor 422 may form a reference side of a current mirror with transistors 424, 426 and 428. Transistors 430, 432, 434 and 436 form cascode (common-gate) devices for the transistors 422, 424, 426 and 428. Additionally, transistors 438 and 440 establish a bias voltage for these devices and keep the transistors 422, 424, 426 and 428 in saturation. FIG. 4 also shows bias current sources 442 and 444.

During operation, the three cascaded common-source amplifiers 402/406, 408/410 and 412/414 with cascaded current source loads may develop very high loop-gain to meet the objective of very low output impedance ($Z_{out}$) at DC and over the modulation bandwidth (such as 1–10 MHz). A capacitor 446 and a resistor 448 as well as a capacitor 450 and a resistor 452 may compensate the amplifier for stability and establish a frequency dependent output impedance at a gate of the transistor 404 because the loop-gain decreases with increasing frequency. Resistors 454 and 456 may isolate the input and output of the amplifier from the controlled transistor 404. The values of the resistors 454 and 456 may be chosen to be large to minimize their noise and to set the output impedance at a high frequency. For example, at a low frequency, the output impedance (Zout) may be approximately $$Z_{out} \cong \frac{R_3 \| R_4}{1 + T},$$

where T is the DC loop-gain, which is equal to the product of the voltage gains of the three cascaded common-source stages. Additionally, at high frequency when the loop-gain is very small, the output impedance may be approximately Zout≅$R_3 \| R_4$. Because the loop-gain decreases with increasing frequency, the output impedance rises with frequency over a range determined by the compensation network.

FIG. 4 also shows the input node 210 to receive an RF signal. The RF signal may pass through the coupling capacitor 220 and to a gate of the transistor 404. FIG. 4 further shows that the inductor 230 may be coupled between the voltage source Vdd and the drain of the transistor 404. The drain of the transistor 404 may be coupled to the output node 240. Other embodiments for the input and output of the RF signals are also within the scope of the present invention.

Figure 5:
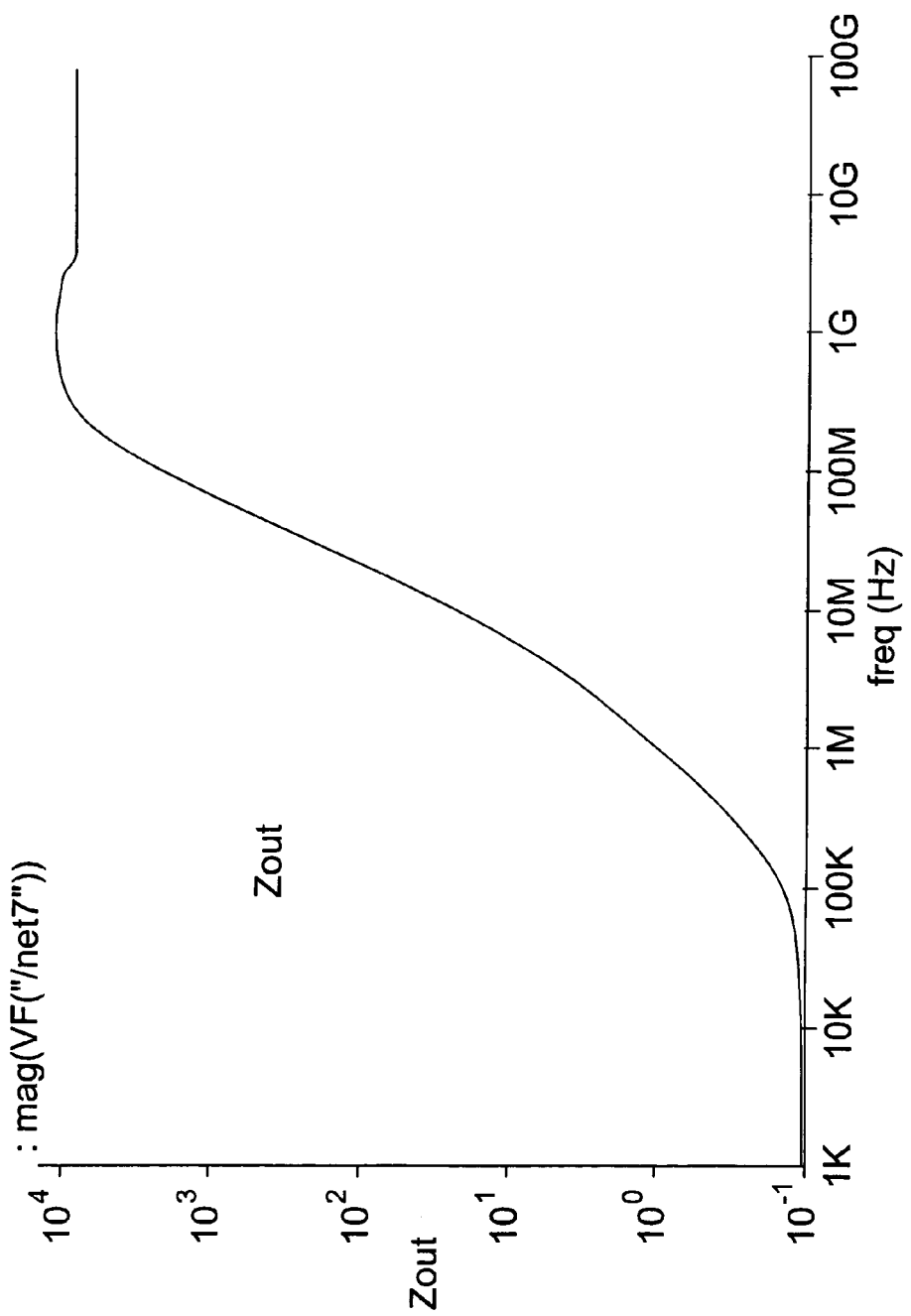
FIG. 5 is a graph showing inductive behaviour of impedance ($Z_{out}$) relative to frequency according to an example embodiment of the present invention.

FIG. 5 is a graph showing inductive behaviour of output impedance relative to frequency according to an example embodiment of the present invention. Other embodiments, graphs and data are also within the scope of the present invention. As shown for two example points on the graph, the DC output impedance is approximately 0.1 ohms, and when the frequency is greater than 1 GHz, the output impedance is approximately 5K ohms.

Embodiments of the present invention may be provided within various electronic systems that include RF amplifiers. Examples of represented systems may include but are not limited to computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A circuit comprising:
    an amplifying transistor having an input; and
    a bias circuit coupled to the amplifying transistor, the bias circuit including a first amplifier and a second amplifier, the second amplifier of the bias circuit to provide a controlled impedance to the input of the amplifying transistor based on a frequency of a signal of the input.
2. The circuit of claim 1, wherein the first amplifier and the second amplifier are coupled in a negative feedback loop.

3. The circuit of claim 1, wherein the second amplifier comprises a non-inverting amplifier and the first amplifier comprises an inverting amplifier.

4. A circuit comprising:
an amplifying transistor having an input; and
a bias circuit coupled to the amplifying transistor, the bias circuit to provide a controlled impedance to the input of the amplifying transistor based on a frequency of a signal at the input, the bias circuit including a first amplifier, a second amplifier, a first isolating resistor coupled between the first amplifier and the amplifying transistor, and a second isolating resistor coupled between the first isolating resistor and an output of the second amplifier.

5. The circuit of claim 1, wherein the first amplifier and the amplifying transistor comprise a current mirror.

6. The circuit of claim 1, wherein the bias circuit provides a low impedance at a low frequency and a high impedance at a high frequency.

7. The circuit of claim 1, wherein the bias circuit is coupled to a gate of the amplifying transistor.

8. The circuit of claim 1, wherein the amplifying transistor comprises a radio frequency (RE) transistor.

9. The circuit of claim 1, wherein the amplifying transistor and the bias circuit are provided on one chip.

10. A device comprising:
a radio frequency (RF) amplifying device to amplify a signal provided at an input; and
a bias circuit coupled to the input of the RF amplifying device to provide a varying impedance at the input of the RF amplifying device, the bias circuit including a first amplifier and a second amplifier, the second amplifier of the bias circuit to provide the varying impedance to the input of the RF amplifying device based on a frequency of the signal at the input.

11. The device of claim 10, wherein the bias circuit provides a frequency dependent impedance at the input of the RF amplifying device.

12. The device of claim 11, wherein the bias circuit provides a low impedance at a low frequency and a high impedance at a high frequency.

13. The device of claim 10, wherein the first amplifier and the second amplifier are coupled in a negative feedback loop.

14. The device of claim 10, wherein the second amplifier comprises a non-inverting amplifier and the first amplifier comprises an inverting amplifier.

15. A device comprising:
a radio frequency (RF) amplifying device to amplify a signal provided at an input; and
a bias circuit coupled to the input of the RE amplifying device to provide a varying impedance at the input of The RF amplifying device based on a frequency of the signal at the input, the bias circuit including a first amplifier, a second amplifier, a first isolating resistor coupled between the first amplifier and the RF amplifying device, and a second isolating resistor coupled between the first isolating resistor and an output of the second amplifier.

16. The device of claim 10, wherein the first amplifier and the RF amplifying device comprise a current mirror.

17. The device of claim 10, wherein the RF amplifying device comprises an amplifying transistor and the bias circuit is coupled to a gate of the amplifying transistor.

18. The device of claim 10, wherein the RF amplifying device and the bias circuit are provided on one chip.

19. A system comprising:
a transmitting device to transmit radio frequency (RF) signals;
a RF amplifying device coupled to the antenna device to amplify an RF signal to be transmitted by the transmitting device; and
a bias circuit coupled to the RF amplifying device, the bias circuit including at least one amplifier to provide a controlled impedance to an input of the RF amplifying device based on a frequency of the RF signal.

20. The system of claim 19, wherein the at least one amplifier includes a first amplifier and a second amplifier coupled in a negative feedback loop.

21. The system of claim 20, wherein the second amplifier comprises a non-inverting amplifier and the first amplifier comprises an inverting amplifier.

22. A system comprising:
a transmitting device to transmit radio frequency (RF) signals;
a RF amplifying device coupled to the antenna device to amplify an RF signal to be transmitted b the transmitting device; and
a bias circuit coupled to the RF amplifying device to provide a controlled impedance to an input of the RF amplifying device based on a frequency of the RF signal to be transmitted, the bias circuit including a first amplifier, a second amplifier, a first isolating resistor coupled between the first amplifier and the RF amplifying device, and a second isolating resistor coupled between the first isolating resistor and an output of the second amplifier.

23. The system of claim 19, wherein the RF amplifying device and the bias circuit are provided on one chip.

24. A circuit comprising:
an amplifying transistor; and
a bias circuit coupled to the amplifying transistor, the bias circuit including a first amplifier and a second amplifier, the second amplifier to present a controlled impedance to a control input of the amplifying transistor based on a frequency of a signal at the control input.

25. The circuit of claim 24, wherein the second amplifier presents the controlled impedance such that a low impedance is presented to the control input of the amplifying transistor at low frequencies and a high impedance is presented to the control input of the amplifying transistor at high frequencies.

26. The circuit of claim 24, wherein a frequency response of the second amplifier is contoured to provide the controlled impedance to the gate of the amplifying transistor.

27. The circuit of claim 24, wherein the bias circuit further includes a first isolating resistor coupled between the first amplifier and the amplifying transistor, and a second isolating resistor coupled between the first isolating resistor and an output of the second amplifier.

* * * * *